(12) United States Patent
Taniguchi

(10) Patent No.: US 7,595,475 B2
(45) Date of Patent: Sep. 29, 2009

(54) IMAGE-PICKUP APPARATUS HAVING A FOCUS CONTROLLER AND AN EXPOSURE CONTROLLER

(75) Inventor: Hidenori Taniguchi, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/181,001

(22) Filed: Jul. 28, 2008

(65) Prior Publication Data

US 2009/0032678 A1 Feb. 5, 2009

(30) Foreign Application Priority Data

Aug. 3, 2007 (JP) ............................. 2007-203141

(51) Int. Cl.
*H01L 27/00* (2006.01)

(52) U.S. Cl. .................................. 250/208.1; 250/201.4
(58) Field of Classification Search .............. 250/208.1, 250/214 R, 201.4, 201.5; 348/208.12; 396/79, 396/111
See application file for complete search history.

(56) References Cited

U.S. PATENT DOCUMENTS 5,751,354 A * 5/1998 Suzuki et al. ............... 348/349

FOREIGN PATENT DOCUMENTS

JP 2003-241064 8/2003

* cited by examiner

*Primary Examiner*—Que T Le
(74) *Attorney, Agent, or Firm*—Cowan, Liebowitz & Latman, P.C.

(57) ABSTRACT

The image-pickup apparatus includes a focus detector generating focus detection information using light from an image-pickup optical system, a photometer generating photometry information using the light from the image-pickup optical system, a focus controller performing focus control, and an exposure controller performing exposure control. The photometer includes first and second photoelectric conversion part having different spectral sensitivity characteristics and formed to at least partially overlap each other in a light entrance direction from the image-pickup optical system. The photometer generates the photometry information based on the output from the first photoelectric conversion part. The focus controller performs the focus control using the focus detection information and focus correction information obtained based on the outputs from the first and second photoelectric conversion parts. The exposure controller performs the exposure control using the photometry information and exposure correction information obtained based on the outputs from the first and second photoelectric conversion part.

4 Claims, 10 Drawing Sheets

IMAGE-PICKUP APPARATUS HAVING A FOCUS CONTROLLER AND AN EXPOSURE CONTROLLER

BACKGROUND OF THE INVENTION

The present invention relates to an image-pickup apparatus which performs autofocus (AF) by a so-called TTL phase difference detection method, and more particularly to an image-pickup apparatus which has a color measurement function used for light source detection.

In the TTL phase difference detection method, a pair of images formed by light that has passed through an image-pickup lens are photoelectrically converted by a light-receiving element for focus detection such as an image sensor, and a defocus amount of the image-pickup lens is calculated based on a displacement amount (phase difference) of the pair of images. Most of the light-receiving elements used for the focus detection are constituted of P-N junction type photodiodes. Their sensitivities extend from a visible wavelength region to a near-infrared wavelength region. This extension enables use of light of the near-infrared wavelength region as assist light irradiated to an object when the focus detection is performed for a dark object.

The image-pickup lens is generally designed so that chromatic aberration can be reduced in the near-infrared wavelength region. In many cases, however, the chromatic aberration is not satisfactorily corrected in the near-infrared wavelength region. Consequently, a proportion of near-infrared light relative to visible light varies among a case where the object is illuminated with sunlight, a case where the object is illuminated with light from a light source of a low color temperature such as a tungsten lamp, and a case where the object is illuminated with light from a light source of a high color temperature such as a fluorescent lamp, which causes different focus detection results. In other words, even in the case of objects equal in distance, the focus detection result varies depending on type of the light source, which disables satisfactory focus control.

To solve such a problem, it is necessary to detect (determine) the type of the light source and to correct the focus detection result based on the detection result.

Japanese Patent Laid-Open No. 2003-241064 discloses an image-pickup apparatus which determines a color of an object, i.e., an achromatic color, blue, green, or red, by using three photometry/color measurement sensors including primary color filters of RGB, and corrects a focus detection result based on the determination result. This determination result is also used for exposure correction.

However, the photometry/color measurement sensor disclosed in Japanese Patent Laid-Open No. 2003-241064 is constituted by using three light-receiving elements different from one another in position in an in-plane direction of a light entrance surface. Consequently, unless a special optical system is provided which causes light fluxes from the same point of the object to similarly form images on the three light-receiving elements, light-receiving fields of the three light-receiving elements are different from one another. The difference in light-receiving field among the three light-receiving elements causes a case where identical images of the object are not formed on the three light-receiving elements depending on an object's shape (e.g., a thin line). In this case, a color of the object cannot be accurately determined, thereby reducing the accuracy of focus detection result correction or exposure correction. In contrast, provision of a special optical system to match the light-receiving fields of the three light-receiving elements increases the size of the image-pickup apparatus.

BRIEF SUMMARY OF THE INVENTION

The present invention provides a compact image-pickup apparatus which includes first and second photoelectric conversion parts having different spectral sensitivity characteristics and being arranged to reduce a difference in light-receiving field, and can improve the accuracy of focus detection result correction or exposure correction by the TTL phase difference detection method.

The present invention provides, according to an aspect thereof, an image-pickup apparatus including a focus detector which generates focus detection information by using light from an image-pickup optical system, a photometer which generates photometry information by using the light from the image-pickup optical system, a focus controller which performs focus control, and an exposure controller which performs exposure control. The photometer includes a first photoelectric conversion part and a second photoelectric conversion part which have different spectral sensitivity characteristics and are formed to at least partially overlap each other in a light entrance direction from the image-pickup optical system. The photometer generates the photometry information based on an output from the first photoelectric conversion part. The focus controller performs the focus control by using the focus detection information and focus correction information obtained based on the output from the first photoelectric conversion part and an output from the second photoelectric conversion part. The exposure controller performs the exposure control by using the photometry information and exposure correction information obtained based on the output from the first photoelectric conversion part and the output from the second photoelectric conversion part.

Other aspects of the present invention will become apparent from the following description and the attached drawings.

DETAILED DESCRIPTION OF THE EMBODIMENTS

Exemplary embodiments of the present invention will hereinafter be described with reference to the accompanying drawings.

Embodiment 1

Figure 1:
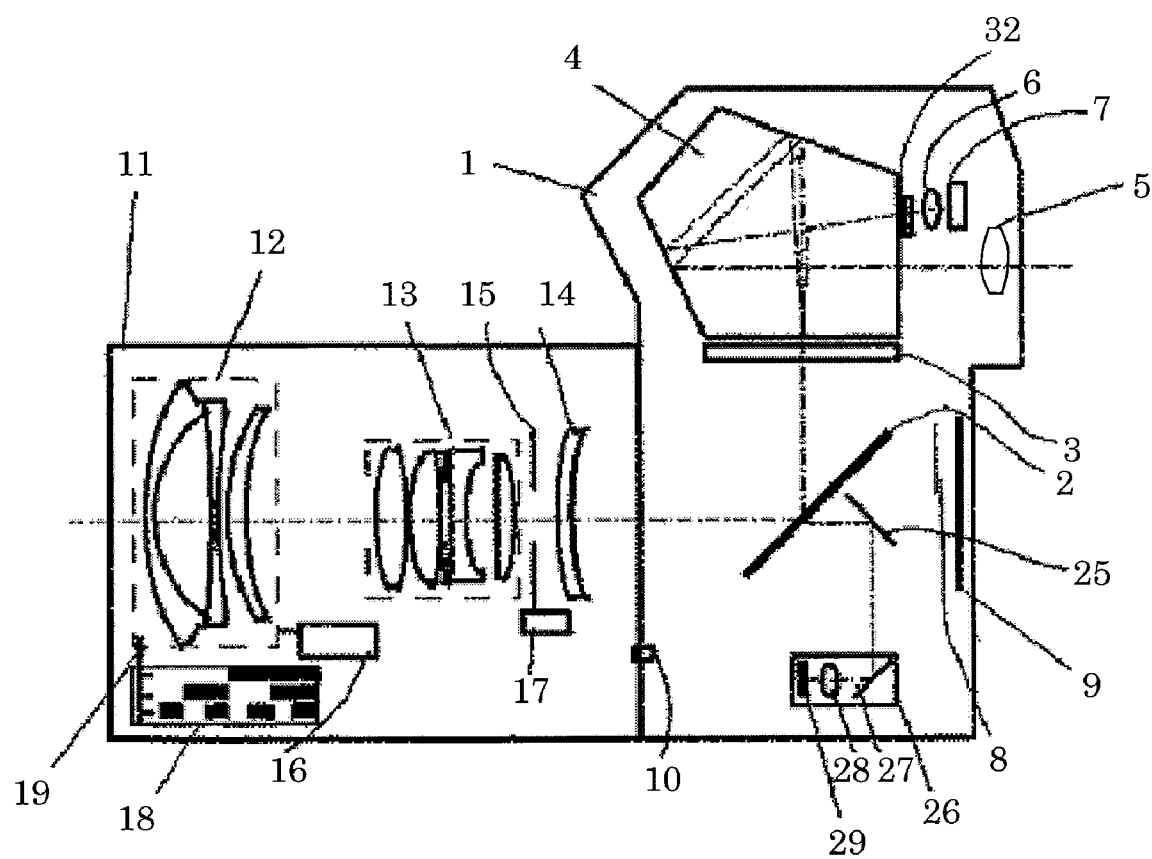
FIG. 1 is a schematic view showing the configuration of a camera system including a camera and an image-pickup lens, the camera being a first embodiment (Embodiment 1) of the present invention.

FIG. 1 shows the configuration of a camera system including a single lens reflex digital camera which is an image-pickup apparatus that is a first embodiment (Embodiment 1) of the present invention and an interchangeable image-pickup lens mounted on the camera.

Referring to FIG. 1, reference numeral 1 denotes the camera on the front of which the image-pickup lens 11 is mounted. The camera 1 incorporates an optical component, a mechanical component, and an image-pickup element, which will be described below.

In the camera 1, reference numeral 2 denotes a main mirror which is obliquely disposed in an image-pickup optical path in a viewfinder observing state, and is retracted out of the image-pickup optical path in an image picking-up state. The main mirror 2 is a half mirror. The main mirror 2 transmits, when obliquely disposed in the image-pickup optical path, about half of a light flux from an object that has passed through the image-pickup lens 11 to cause it to reach a focus detection optical system described below.

Reference numeral 3 denotes a focus plate disposed in a predetermined image-forming plane of an image-pickup optical system described below. Reference numeral 4 denotes a penta prism for changing a viewfinder optical path. Reference numeral 5 denotes an eyepiece. A user can observe an image-pickup region by observing the focus plate 3 through the eyepiece 5.

Reference numeral 7 denotes a photometry sensor which measures luminance of the object. Reference numeral 6 denotes an image-forming lens which projects an object image formed by a light flux from the focus plate 3 on the photometry sensor 7. Reference numeral 32 denotes an IR cut filter which cuts light of a wavelength region longer than a near-infrared wavelength in a light flux proceeding toward the photometry sensor 7. The IR cut filter 32 has the same characteristic as that of an IR cut filter (not shown) which is disposed in a focus detection unit described below. The "same characteristic" includes not only a case where their characteristics are completely the same but also a case where their characteristics can be regarded as the same from the viewpoint of a photometric sensitivity characteristic.

The photometry sensor 7 can generate photometry information in each of plural photometry areas arranged in the image-pickup region. The photometry sensor 7 and the IR cut filter 32 constitute a "photometry unit".

Reference numeral 8 denotes a focal plane shutter. Reference numeral 9 denotes an image-pickup element constituted of a CCD sensor or a CMOS sensor.

Reference numeral 25 denotes a sub-mirror which is obliquely disposed together with the main mirror 2 in the viewfinder observing state, and is retracted out of the image-pickup optical path in the image picking-up state. This sub-mirror 25 reflects downward the light flux transmitted through the main mirror 2 obliquely disposed in the image-pickup optical path to introduce it to the focus detection unit described below.

Reference numeral 26 denotes the focus detection unit which includes a secondary image-forming mirror 27, a secondary image-forming lens 28, a focus detection line sensor 29, a focus detection circuit 105, and the IR cut filter (not shown). The secondary image-forming mirror 27 and the secondary image-forming lens 28 constitute the focus detection optical system which forms a secondary image-forming plane of the image-pickup lens 11 on the focus detection line sensor 29. The IR cut filer has a characteristic of transmitting not only light of a visible wavelength region but also near-infrared assist light of a wavelength near 700 nm which is projected from an assist light source (not shown) when the object has a low luminance or a low contrast.

The focus detection unit 26 generates a pair of image signals used for detecting a focus state of the image-pickup lens 11 by the TTL phase difference detection method to output it to a camera microcomputer described below. The focus detection unit 26 can generate the pair of image signals in each of plural focus detection areas arranged in the image-pickup region.

Reference numeral 10 denotes plural mount contacts which serve as communication interfaces with the image-pickup lens 11.

In the image-pickup lens 11, reference numerals 12 to 14 denote lens units constituting the image-pickup optical system. The image-pickup optical system is constituted by, in order from an object side, a first lens unit (hereinafter referred to as focus lens) 12, a second lens unit 13, a third lens unit 14, and an aperture stop 15. The focus lens 12 is moved on an optical axis of the image-pickup optical system to perform focusing, and the second lens unit 13 is moved on the optical axis to vary a focal length of the image-pickup lens 11, that is, to perform magnification variation. The third lens unit 14 is fixed.

Reference numeral 16 denotes a focus motor which moves the focus lens 12 in a direction of the optical axis. Reference numeral 17 denotes an aperture stop motor which drives the aperture stop 15 to change its aperture diameter.

Reference numeral 18 denotes a distance encoder. A brush 19 attached to the focus lens 12 slides with respect to the distance encoder 18 associatively with the movement of the focus lens 12, thereby outputting a signal (object distance information) corresponding to a position of the focus lens 12, that is, an object distance.

Figure 2:
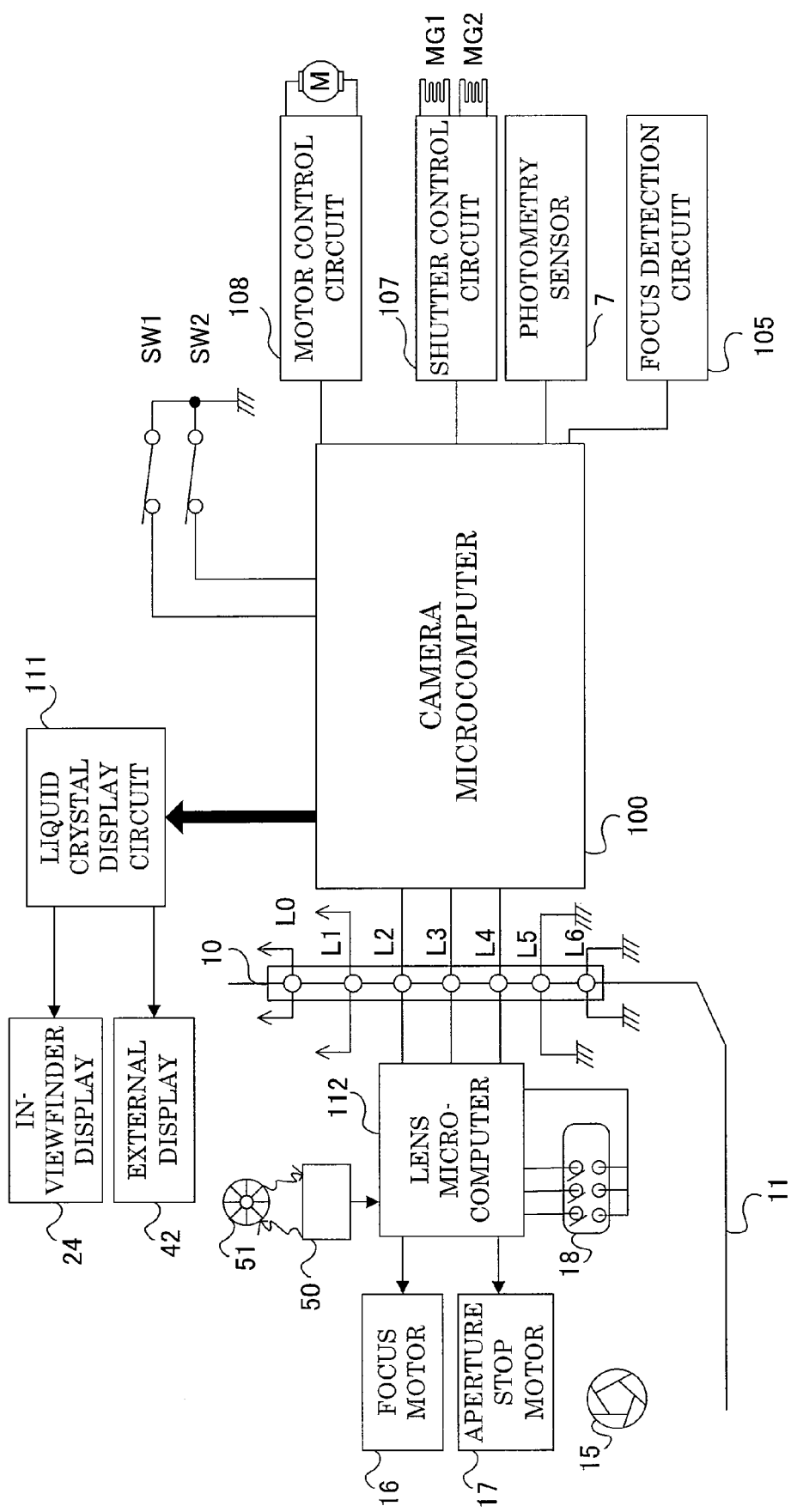
FIG. 2 is a block diagram showing the configuration of an electric circuit of the camera system shown in FIG. 1.

Referring to FIG. 2, the electric circuit configuration of the camera system will be described. In FIG. 2, components identical to those in FIG. 1 are denoted by the same reference numerals.

First, the electric circuit configuration in the camera 1 will be described. The focus detection circuit 105, the photometry sensor 7, a shutter control circuit 107, a motor control circuit 108, and a liquid crystal display circuit 111 are connected to the camera microcomputer 100 constituted of a CPU or the like. The camera microcomputer 100 performs sending and receiving of signals with a lens microcomputer 112 constituted of a CPU or the like and disposed in the image-pickup lens 11 via the plural mount contacts 10.

The focus detection circuit 105 performs charge accumulation control and charge reading control of each of plural pixels constituting the focus detection line sensor 29 according to a signal from the camera microcomputer 100. The focus detection circuit 105 generates the pair of image signals corresponding to a pair of object images formed on the focus detection line sensor 29 to output it. The camera microcomputer 100 performs A/D conversion for the pair of image signals, and calculates (generates) a defocus amount (focus detection information) of the image-pickup lens 11 based on a phase difference which is a displacement amount of the pair of image signals. The camera microcomputer 100 and the focus detection unit 26 constitute a "focus detector".

The camera microcomputer 100 corrects, as described below, the calculated defocus amount according to a light source detection result, and calculates a driving amount (including direction) of the focus lens 12 to obtain an in-focus state based on the corrected defocus amount. The calculated driving amount of the focus lens 12 is transmitted to the lens microcomputer 112 via the mount contact 10. The lens microcomputer 112 drives the focus motor 16 according to the received driving amount of the focus lens 12 to move the focus lens 12 to an in-focus position. The camera microcomputer 100 constitutes a "focus controller".

The camera microcomputer 100 calculates exposure information such as a driving amount of the aperture stop 15 and a shutter speed based on an output (photometry information) from the photometry sensor 7. The driving amount of the aperture stop 7 is transmitted to the microcomputer 112 via the mount contact 10. The camera microcomputer 100 constitutes an "exposure controller".

The shutter control circuit 107 performs energizing control for a front curtain driving electromagnet MG-1 and a rear curtain driving electromagnet MG-2 which constitute a focal plane shutter 8 according to a signal from the camera microcomputer 100. Thereby, the front and rear curtains are moved to perform an exposure operation.

The motor control circuit 108 controls a motor M according to a signal from the camera microcomputer 100. Thereby, the main mirror 2 and the sub-mirror 25 are moved up and down, and the shutter 8 is charged.

Reference numeral SW1 denotes a switch which is turned on by a first stroke (half-pressing) operation of a release button (not shown) to start photometry and autofocus (AF) operations. Reference numeral SW2 is a switch which is turned on by a second stroke (full-pressing) operation of the release button to start shutter traveling, i.e., the exposure operation. The states of the switches SW1 and SW2 are read by the camera microcomputer 100.

The liquid crystal display circuit 111 controls a in-viewfinder display 24 and an external display 42 according to signals from the camera microcomputer 100. The in-viewfinder display 24 and the external display 42 display various pieces of image-pickup information.

Next, the electric circuit configuration in the image-pickup lens 11 will be described. The plural mount contacts 10 include a contact L0 for supplying power to the focus motor 16 and the aperture stop motor 17 in the image-pickup lens 11, a contact L1 for supplying power to the lens microcomputer 112, and a contact L2 for supplying a clock signal to perform serial data communication. The mount contacts 10 further include a contact L3 for data transmission from the camera 1 to the image-pickup lens 11, a contact L4 for data transmission from the image-pickup lens 11 to the camera 1, a ground contact L5 for the motors, and a ground contact L6 for the lens microcomputer 112.

The lens microcomputer 112 drives the focus motor 16 and the aperture stop motor 17 according to information of the focus lens driving amount or the aperture stop driving amount from the camera microcomputer 100.

Reference numerals 50 and 51 respectively denote an optical detector and a pulse plate. The lens microcomputer 112 counts the number of pulses to obtain position information of the focus lens 12 during driving thereof. This enables the movement of the focus lens 12 to a position according to the focus lens driving amount from the camera microcomputer 100. Further, the lens microcomputer 112 converts position information of the focus lens 2 obtained by the distance encoder 18 into object distance information to transmit it to the camera microcomputer 100.

Figures 3A, 3B:
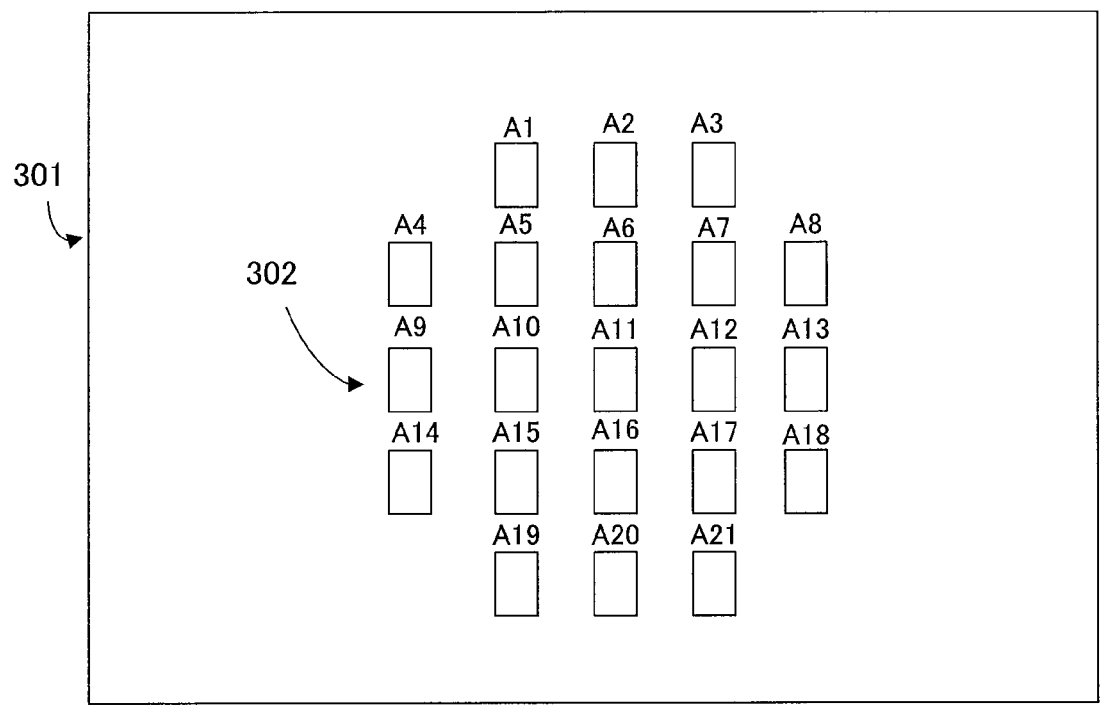
FIG. 3A shows an arrangement example of focus detection areas in the camera of Embodiment 1.
FIG. 3B shows an arrangement example of photometry areas in the camera of Embodiment 1.
Figure 3C:
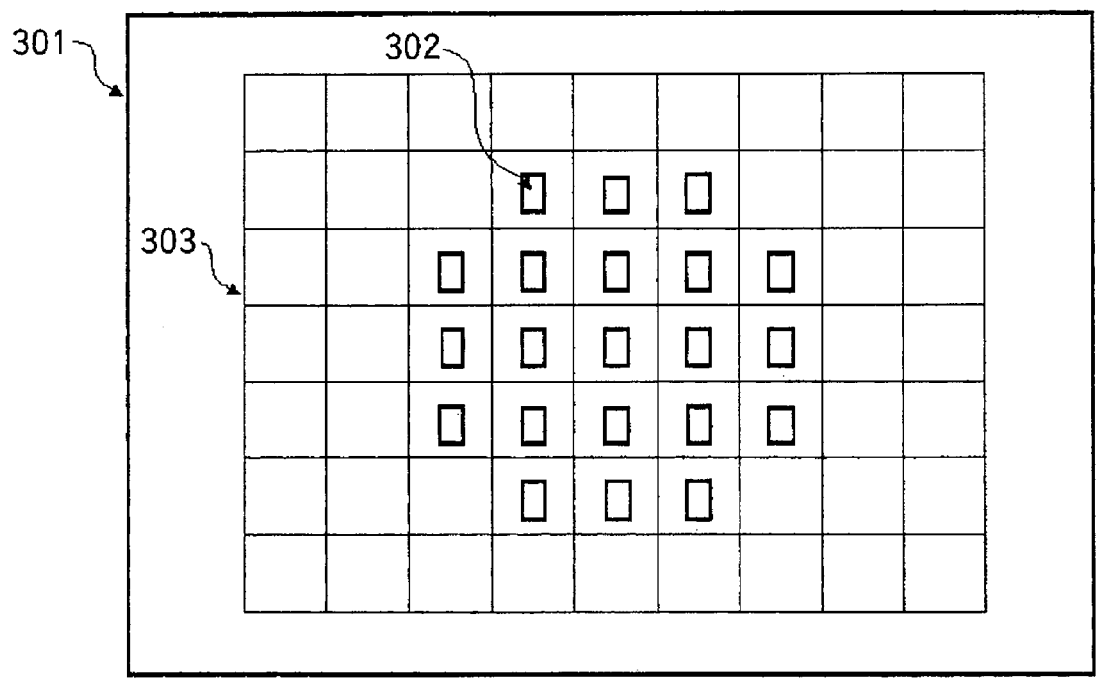
FIG. 3C shows the focus detection areas and the photometry areas shown in FIGS. 3A and 3B in an overlapped state.

FIGS. 3A to 3C respectively show examples of arrangements of the focus detection areas and the photometry areas in image-pickup regions in this embodiment.

FIG. 3A shows the arrangement of the focus detection areas in the image-pickup region. Reference numeral 301 denotes the image-pickup region, and reference numeral 302 denotes the plural (21 in this embodiment) focus detection areas. In FIG. 3A, reference characters A1 to A21 are added to the 21 focus detection areas. The number and the arrangement of the focus detection areas in alternative embodiments of the present invention are not limited to those shown in FIG. 3A.

FIG. 3B shows the arrangement of the photometry areas in the image-pickup region 301. Reference numeral 303 denotes the plural (63 in this embodiment) photometry areas. In FIG. 3B, reference characters Bmn (m=0, 1, 2 ... 6, and n=0, 1, 2 ... 8) are added to the 63 photometry areas: m representing a row number, and n representing a column number. The number and the arrangement of the photometry areas in alternative embodiments of the present invention are not limited to those shown in FIG. 3B.

FIG. 3C shows the focus detection areas and the photometry areas in an overlapped manner. In a central area (first area) which is a nearly circular area including the center of the image-pickup region 301, the 21 focus detection areas 302 and 21 photometry areas 303 of the 63 photometry areas are arranged to overlap (match) each other. In a peripheral area (second area) surrounding the central area, 42 photometry areas 303 of the 63 photometry areas are arranged. A completely matched relationship as shown in the central area in FIG. 3C is not necessarily needed between the focus detection areas and the photometry areas. The focus detection areas and the photometry areas are only necessary to be at least partially overlapped.

Figure 4:
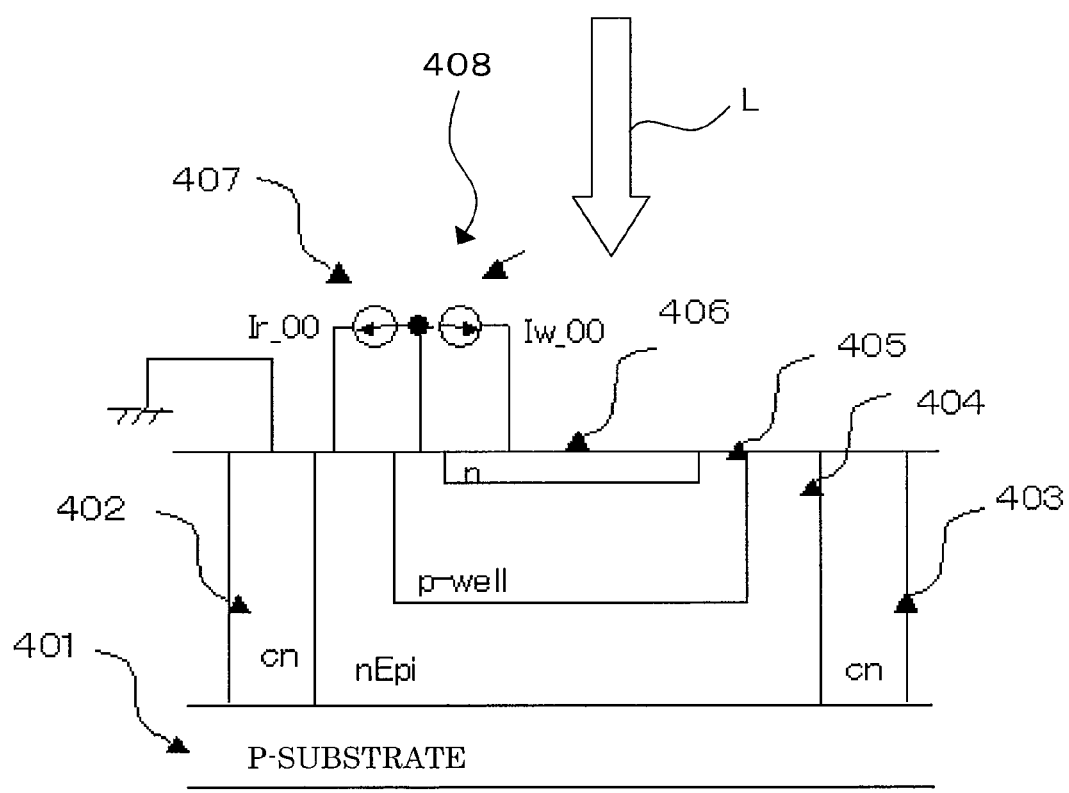
FIG. 4 is a sectional view showing an example of a vertical structure of a photometry sensor in Embodiment 1.

FIG. 4 shows a vertical sectional structure of the B00 pixel as an exemplary structure of the photometry sensor 7.

In FIG. 4, reference numeral 401 denotes a p-type semiconductor substrate (hereinafter referred to as p-substrate). Reference numerals 402 and 403 denote p-type areas (hereinafter referred to as cn-areas) formed for electrical connection with the p-substrate 401 and separation from adjacent pixels. Electrodes are drawn from the cn-areas 402 and 403, and the p-substrate 401 is connected to ground (GND) for electrical pixel separation.

Reference numeral 404 denotes an n-type epitaxial layer (hereinafter referred to as nEpi) formed on the p-substrate 401. Reference numeral 405 denotes a p-type well (hereinafter referred to as p-well) formed inside the nEpi 404. Reference numeral 406 denotes an n-type area (hereinafter referred to as n-area) formed inside the p-well 405.

Reference numeral 407 denotes a photocurrent Ir_00 flowing through a p-n junction portion of a second photoelectric conversion part (photodiode) constituted of the nEpi 404 and the p-well 405. The Ir_00 means a photocurrent Iw from the B00 pixel. The second photoelectric conversion part has the peak of spectral sensitivity from a red wavelength region to an infrared wavelength region.

Reference numeral 408 denotes a photocurrent Iw__00 flowing through a p-n junction portion of a first photoelectric conversion part (photodiode) constituted of the p-well 405 and the n-area 406. The Iw__00 means a photocurrent Iw from the B00 pixel. The first photoelectric conversion part has the peak of spectral sensitivity in the visible wavelength region.

Thus, the first and second photoelectric conversion parts have different spectral sensitivity characteristics, and are formed into a vertical structure so that they overlaps each other in a direction of light L entering from the image-pickup lens 11 (that is, in a thickness (depth) direction of the photometry sensor 7). In other words, the first and second photoelectric conversion parts are formed on the same semiconductor substrate so as to overlap each other in a thickness direction of the substrate.

The sensor structure shown in FIG. 4 is only an example. In alternative embodiments of the present invention, it is only necessary to form a vertical structure where the first and second photoelectric conversion parts having different spectral sensitivity characteristics at least partially overlap each other in the direction of the light entering from the image-pickup lens 11. In other words, the first and second photoelectric conversion parts may be slightly shifted from each other in an in-plane direction of a light entrance surface of the photometry sensor 7. The number of the photoelectric conversion parts having different spectral sensitivity characteristics is not limited to two.

The photocurrents Iw__00 and Ir__00 are logarithmically compressed by an electric circuit in the photometry sensor 7 to be converted into voltages Vw__00 (first output or first signal) and Vr__00 (second output or second signal), and are output to the camera microcomputer 100. The voltages Vw__00 and Vr__00 mean output voltages Vw and Vr corresponding to the photocurrents Iw and Ir from the B00 pixel.

Figure 5A:
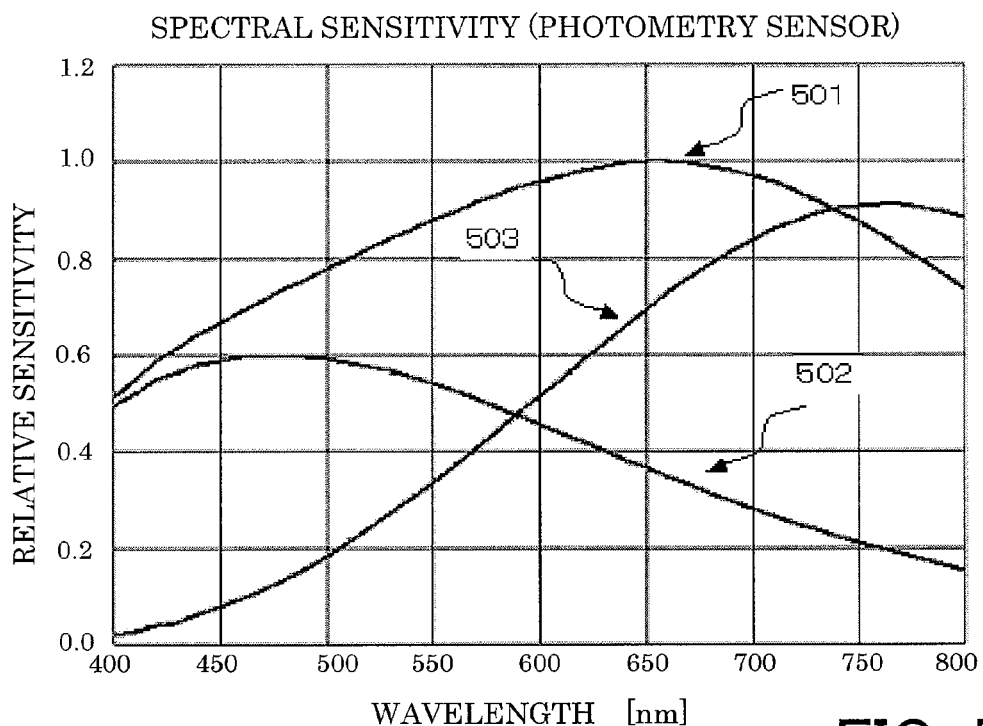
FIG. 5A shows a spectral sensitivity characteristic of the photometry sensor in Embodiment 1.
Figure 5B:
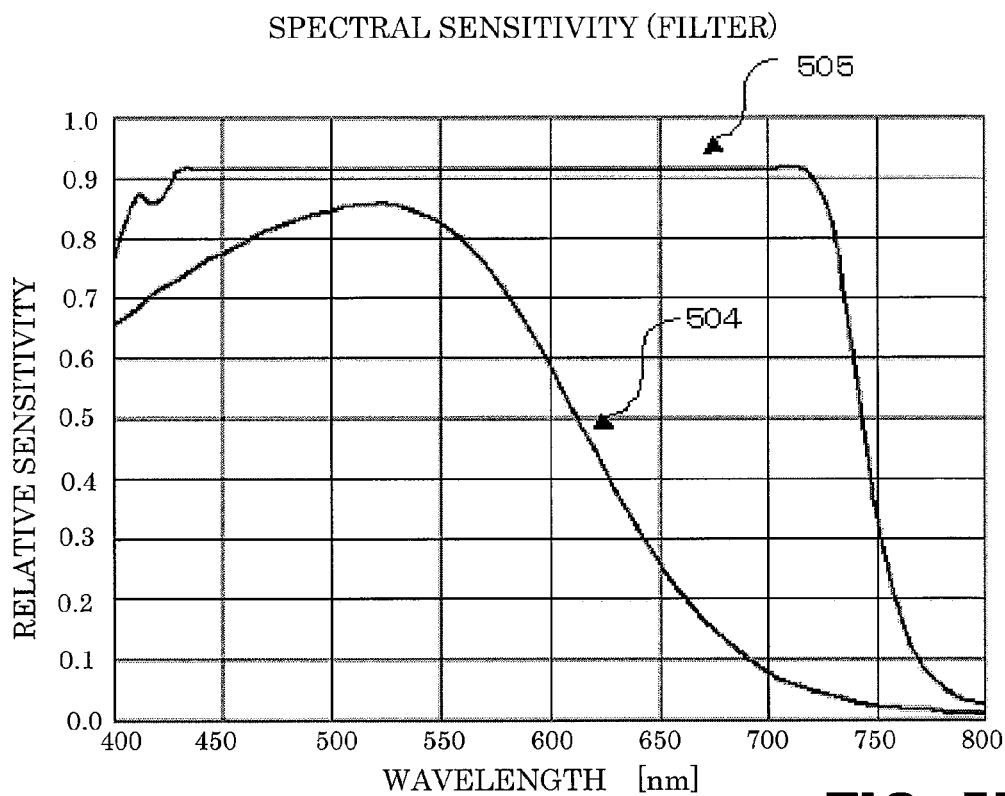
FIG. 5B shows a spectral transmittance characteristic of an optical filter in Embodiment 1.
Figure 5C:
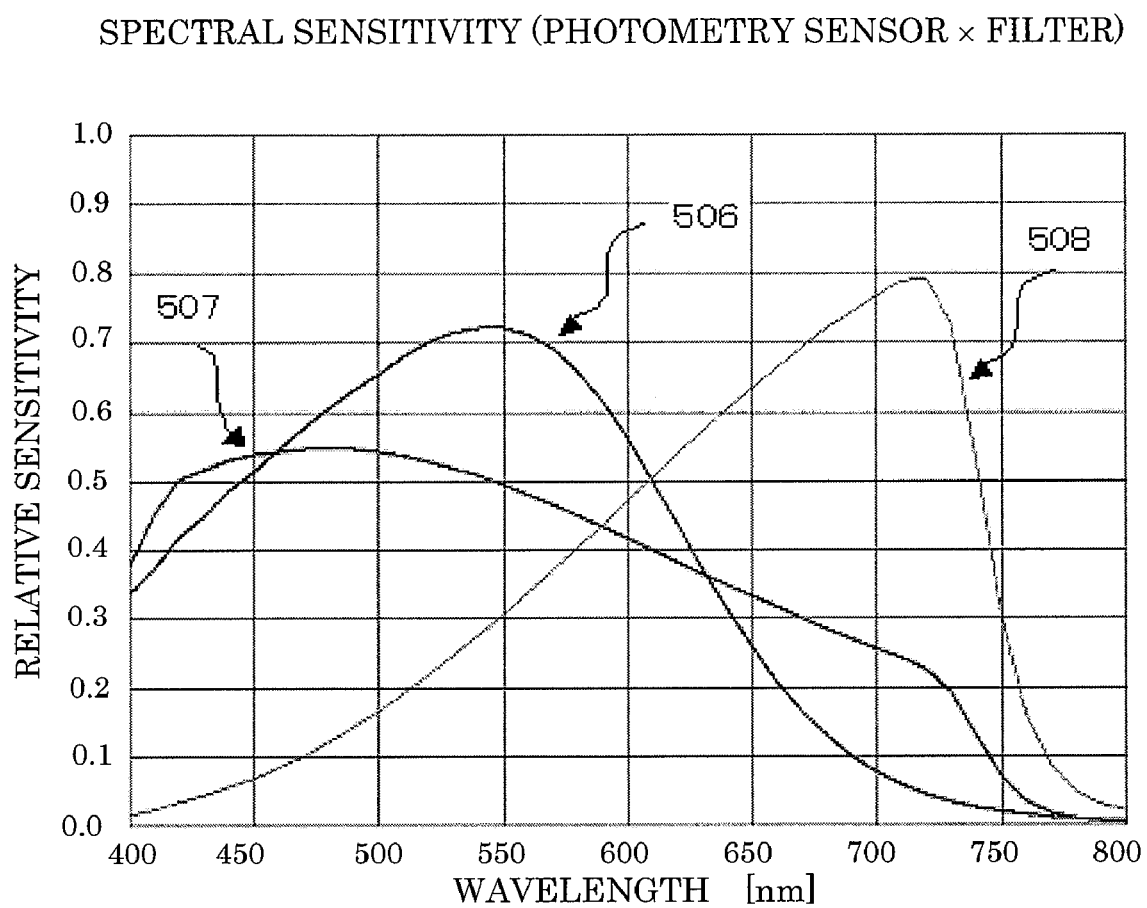
FIG. 5C shows a spectral sensitivity characteristic when the photometry sensor shown in FIG. 5A and the optical filter shown in FIG. 5B are combined together.

FIGS. 5A to 5C show a spectral sensitivity characteristic of a single photometry sensor 7 having the structure shown in FIG. 4, and a spectral sensitivity characteristic of the entire photometry system including the optical system to introduce light to the photometry sensor 7.

FIG. 5A shows the spectral sensitivity characteristic in the single photometry sensor 7, and FIG. 5B shows a spectral transmittance characteristic of an optical filter used for the focus detection and the photometry. FIG. 5C shows the spectral sensitivity characteristic of the entire photometry system where the spectral sensitivity characteristic of the photometry sensor 7 shown in FIG. 5A and the spectral transmittance characteristic of the optical filter shown in FIG. 5B are combined.

Reference numeral 501 in FIG. 5A denotes a spectral sensitivity characteristic of a conventional photometry sensor as a comparative example to this embodiment. The conventional photometry sensor has a spectral sensitivity characteristic whose peak wavelength (principal sensitive wavelength) is 650 nm. The figure shows no spectral sensitivity characteristic for wavelengths of 800 nm and more. However, a photometry sensor that uses silicon usually has sensitivity up to about 1100 nm.

Reference numeral 502 shows a spectral sensitivity characteristic of the first photoelectric conversion part which is constituted by p-n junction of the p-well 11405 and the n-area 406 and outputs the photocurrent Iw__00 in the photometry sensor 7 of this embodiment shown in FIG. 4. The first photoelectric conversion part has a peak sensitivity (principal sensitivity) at a wavelength of around 500 nm. The peak sensitivity wavelength of the first photoelectric conversion part is not limited to near 500 nm, and it may be a slightly shorter or longer wavelength. However, the spectral sensitivity characteristic of human eyes, i.e., the spectral luminous efficiency, has a peak at 555 nm in a bright field. Thus, a desired peak sensitivity wavelength is around 555 nm.

Reference numeral 503 denotes a spectral sensitivity characteristic of the second photoelectric conversion part which is constituted by p-n junction of the nEpi404 and the p-well 4-5 and outputs the photocurrent Ir__00 in the photometry sensor 7 of FIG. 4. The second photoelectric conversion part has a peak sensitivity (principal sensitivity) at a wavelength of around 750 nm. The peak sensitivity wavelength of the second photoelectric conversion part is not limited to near 750 nm, and it may be a slightly shorter or longer wavelength. However, it is desirable to have a sufficient sensitivity at a wavelength near that of the assist light used during the focus detection.

In FIG. 5B, reference numeral 504 denotes a spectral transmittance characteristic of a luminous efficiency correction filter which is disposed on the front of the conventional photometry sensor having the spectral sensitivity characteristic 501 shown in FIG. 5A and is used for causing the spectral sensitivity characteristic of the photometry sensor to be close to the spectral luminous efficiency of human eyes.

Reference numeral 505 denotes a spectral transmittance characteristic of the IR cut filter disposed on the front of the focus detection line sensor 29 to cut superfluous infrared light. For the IR cut fitter, an infrared cut frequency is set to sufficiently transmit the assist light. The IR cut filter 32 disposed on the front of the photometry sensor 7 shown in FIG. 1 has the same spectral transmittance characteristic as that spectral transmittance characteristic.

In FIG. 5C, reference numeral 506 denotes a spectral sensitivity characteristic (hereinafter referred to as conventional characteristic) when the luminous efficiency correction filter is combined with the conventional photometry sensor. The spectral sensitivity characteristic 501 of the conventional photometry sensor shown in FIG. 5A is corrected by the spectral transmittance characteristic 504 of the luminous efficiency correction filter to provided a peak sensitivity at a wavelength near 555 nm, similarly to the spectral luminous efficiency.

Reference numeral 507 denotes a spectral sensitivity characteristic when the spectral sensitivity characteristic 502 of the first photoelectric conversion part (405, 406) shown in FIG. 5A is combined with the spectral transmittance characteristic of the IR cut filter 32. In the spectral sensitivity characteristic, sensitivities for blue and red light components are increased relative to the conventional characteristic 506.

Reference numeral 508 denotes a spectral sensitivity characteristic when the spectral sensitivity characteristic 503 of the second photoelectric conversion part (404, 405) shown in FIG. 5A is combined with the spectral transmittance characteristic of the IR cut filter 32. The spectral sensitivity characteristic has a peak sensitivity at a wavelength around 700 nm which is the wavelength of the assist light.

Figure 6:
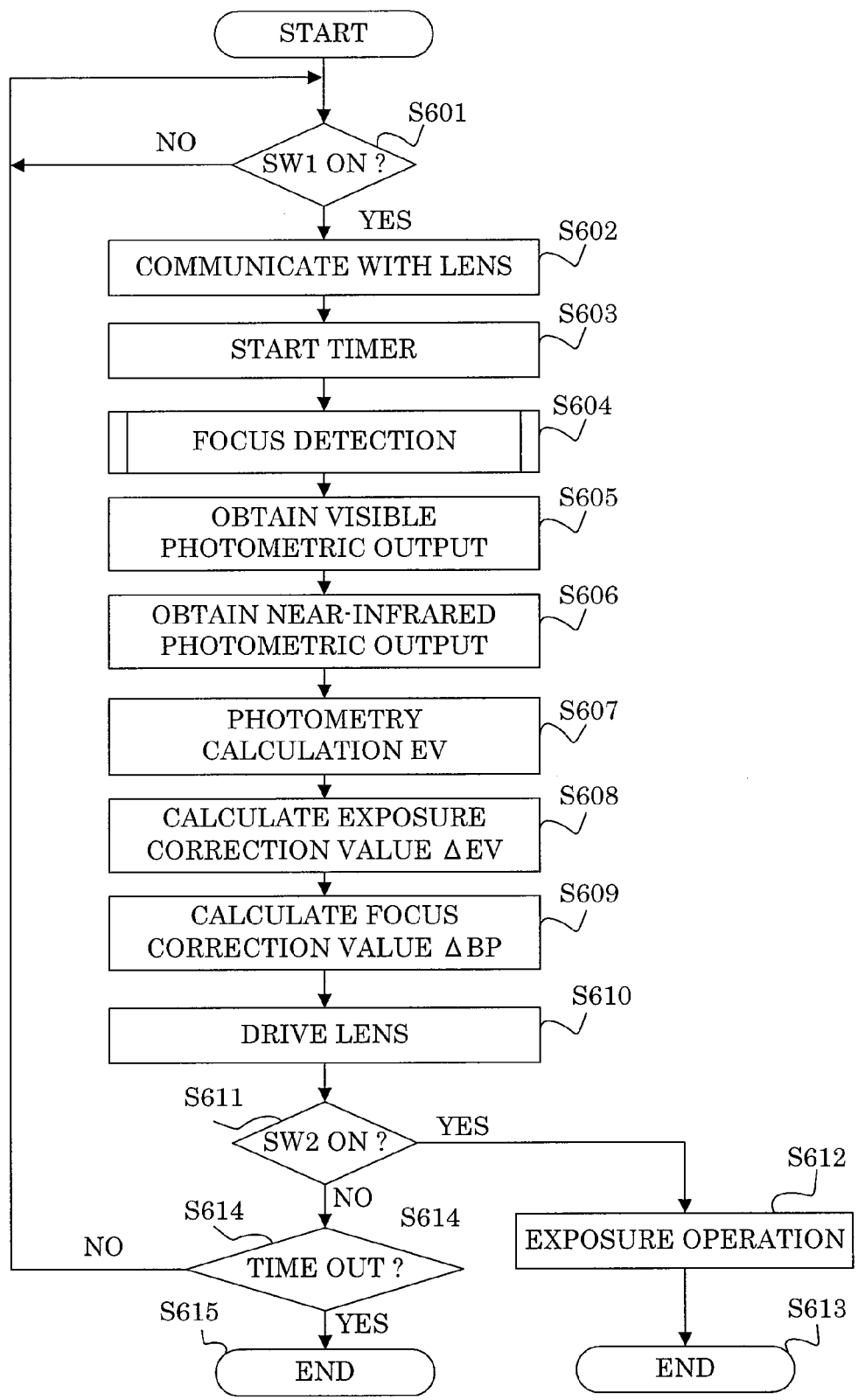
FIG. 6 is a flowchart showing AF and photometry operations in Embodiment 1.

FIG. 6 is a flowchart showing the photometry and AF operations which use the pixel structure shown in FIG. 4 and the IR cut filter 32. The photometry and AF operations are performed by the camera microcomputer 100 according to a computer program stored therein.

In step s601, the camera microcomputer 100 determines a state of the switch SW1. The camera microcomputer 100 proceeds to step s602 if the switch SW1 is half-pressed (SW1 on), or repeats step s601 if it is not half-pressed.

In step s602, the camera microcomputer 100 communicates with the lens microcomputer 112 to obtain information relating to the image-pickup lens 11 such as a focal length, a full-open aperture value, a minimum aperture value, or chromatic aberration data necessary for the AF and photometry operations, and then proceeds to step s603.

In step s603, the camera microcomputer 100 starts a timer, and then proceeds to step s604.

In step s604, the camera microcomputer 100 performs a focus detection operation at, among the 21 focus detection areas, a focus detection area selected by the camera microcomputer 100 or a user to calculate a defocus amount of the image-pickup lens 11. Then, the camera microcomputer 100 calculates a driving amount BP of the focus lens 12 from the defocus amount.

In step s605, the camera microcomputer 100 obtains a photometric output of the visible wavelength region (that is, an output from the first photoelectric conversion part) from the photometry sensor 7. Specifically, the camera microcomputer 100 sequentially obtains output voltages Vw_00 to Vw_68 from the B00 pixel to the B68 pixel shown in FIG. 3 in the photometry sensor 7 to convert them into digital data by an A/D converter (not shown) in the camera microcomputer 100. The camera microcomputer 100 stores the digital data (hereinafter referred to as Vw data) in a memory (not shown) in the camera microcomputer 100.

In step s607, the camera microcomputer 100 obtains a photometric output of a near-infrared wavelength region (that is, an output from the second photoelectric conversion part) from the photometry sensor 7. Specifically, the camera microcomputer 100 sequentially obtains output voltages Vr_00 to Vr_68 from the B00 pixel to the B68 pixel in the photometry sensor 7 to convert them into digital data by the A/D converter, and then stores the digital data (hereinafter referred to as Vr data) in the memory.

In step s607, the camera microcomputer 100 performs photometry calculation for each pixel based on the Vw data obtained from each pixel in step s605 to calculate (generate) an Ev value (exposure information) for each pixel.

In step s608, the camera microcomputer 100 calculates an exposure correction value (exposure correction information) ΔEv for each pixel based on a ratio (color measurement information) of the Vw data of each pixel to the Vr data thereof. The exposure correction value ΔEv is a value for correcting a value of the Vw data which includes an error caused due to a color of the object or a color temperature of a light source illuminating the object. The exposure correction value ΔEv may be calculated by using an arithmetic expression, or may be read from a data table. The camera microcomputer 100 adds the exposure correction value ΔEv to the Ev value calculated in step s607 to generate a light-source-corrected Ev value for each pixel.

Further, the camera microcomputer 100 performs predetermined weighting calculation for the light-source-corrected Ev values of all the pixels, and then calculates, based on the result of the weighting calculation, final exposure control values such as a shutter speed and an aperture value for the exposure operation.

In step s609, the camera microcomputer 100 calculates, based on the ratio of the Vw data to the Vr data, a focus correction value (focus correction information) ΔBP to correct the defocus amount calculated in step s604. In this embodiment, in the central area of the image-pickup region, one photometry area (a pixel of the photometry sensor 7) is provided for one focus detection area. Accordingly, the camera microcomputer 100 calculates the focus correction value ΔBP for one focus detection area by using the ratio of the Vw data to the Vr data of the photometry sensor pixel corresponding to the one focus detection area. Specifically, the camera microcomputer 100 calculates the focus correction value ΔBP by using the ratio of the Vw data to the Vr data and chromatic aberration information of the image-pickup lens 11. The focus correction value ΔBP may be calculated by using an arithmetic expression, or may be read from a data table.

Then, the camera microcomputer 100 adds the focus correction value ΔBP to the defocus amount calculated in step s604 to calculate a final driving amount of the focus lens 12.

In step s610, the camera microcomputer 100 transmits information of the driving amount of the focus lens 12 to the lens microcomputer 112 to cause the lens microcomputer 112 to drive the focus lens 12.

In step s611, the camera microcomputer 100 determines whether or not the switch SW2 is fully pressed. The camera microcomputer 100 performs the exposure operation (image-pickup operation) in step s612 if the switch SW2 is fully pressed (SW2 on). The camera microcomputer 100 determines whether or not a predetermine time has elapsed in step s614 if the switch SW2 is not fully pressed.

If the predetermine time has elapsed, the camera microcomputer 100 completes the AF and photometry operations in step s615. If the predetermine time has not elapsed, the camera microcomputer 100 returns to step s601 to continue the AF and photometry operations.

This embodiment employs, for the pixel structure of the photometry sensor 7, a stacked layer structure where the first and second photoelectric conversion parts different from each other in spectral sensitivity characteristics are stacked in the thickness direction of the photometry sensor 7, thereby providing the same characteristic to the IR cut filter 32 as that of the IR cut filter of the focus detection unit 26. This embodiment thereby enables acquisition of color measurement information (information of a color temperature or a light source) to correct the defocus amount, and correction of an error in the photometric output caused due to the color temperature or the light source.

Moreover, the vertical pixel structure of the photometry sensor 7 in this embodiment can eliminate most of the difference in the light-receiving fields of the first and second photoelectric conversion parts without using any special optical system. Therefore, this embodiment can improve the accuracy of the defocus amount correction or the exposure correction according to the color of the object.

Embodiment 2

Figure 7:
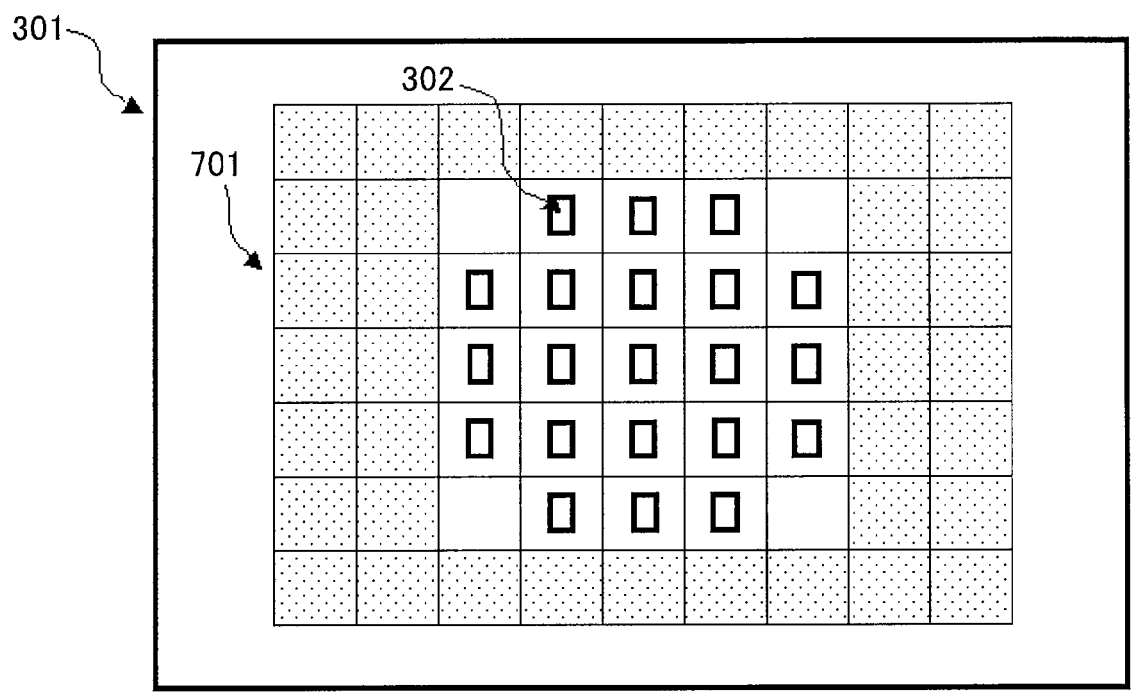
FIG. 7 shows an arrangement example of focus detection areas and photometry areas in a camera which is a second embodiment (Embodiment 2) of the present invention.

FIG. 7 shows the arrangement of focus detection areas and photometry areas in an image-pickup region of a camera which is a second embodiment (Embodiment 2) of the present invention. Components identical to or having identical functions to those in Embodiment 1 are denoted by the same reference numerals as those in Embodiment 1.

Reference numeral 301 denotes an image-pickup region, and reference numeral 302 denotes plural (21 in this embodiment as in Embodiment 1) focus detection areas where focus detection can be performed by a focus detection unit 26. Reference numeral 701 denotes plural (63 in this embodiment as in Embodiment 1) photometry areas where photometry can be performed by a photometry sensor 7.

Pixels on the photometry sensor 7 corresponding to 25 photometry areas shown as white areas in the figure among the 63 photometry areas 701 have the vertical structure shown in FIG. 4. The 25 photometry areas include 21 photometry areas in a central area overlapping the focus detection areas 302 and 4 photometry areas disposed at four corners adjacent to the central area. These 25 photometry areas are included in a first area which is a rectangular area including a center of the entire image-pickup region.

Pixels on the photometry sensor 7 corresponding to dotted photometry areas in a peripheral area (hereinafter also referred to as peripheral photometry areas) other than the above-described 21 photometry areas in the central area have a structure different from the vertical structure shown in FIG. 4. These peripheral photometry areas are included in a second area which is more outside than the first area in the entire image-pickup region.

Figure 8:
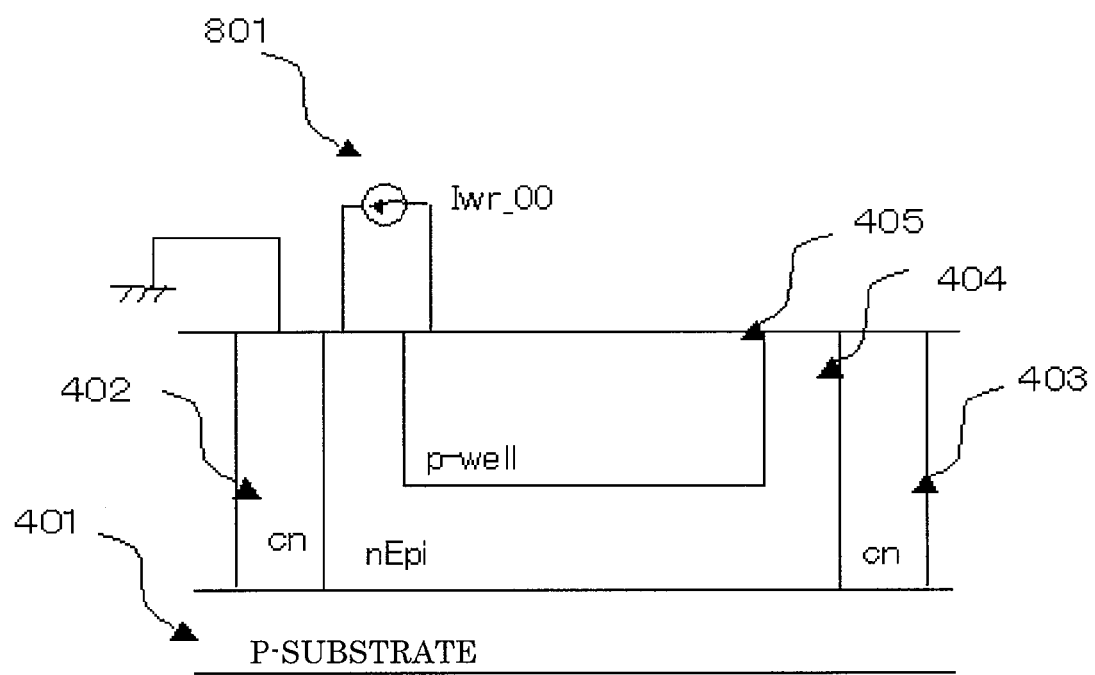
FIG. 8 shows a spectral sensitivity characteristic when a photometry sensor and an optical filter in Embodiment 2 are combined together.

FIG. 8 shows a vertical sectional view of the structure of the pixel corresponding to one of the peripheral photometry areas on the photometry sensor 7. The figure only shows the structure of a B00 pixel. The other pixels also have an identical structure.

In the figure, parts (or portions) identical to those in FIG. 4 are denoted by the same reference numerals as those in FIG. 4.

The pixel structure is different from that shown in FIG. 4 in that no n-area 406 is formed inside a p-well 405.

A photocurrent 801 obtained by this pixel structure is a photocurrent Iwr_00 flowing through the p-n junction portion of a third photoelectric conversion part constituted of an nEpi 404 and the p-well 405. The photocurrent Iwr_00 is an addition of the photocurrents Iw_00 and Ir_00 shown in FIG. 4 because no n-area 406 is formed. The photocurrent Iwr_00 is logarithmically compressed by an electric circuit in the photometry sensor 7 to be output as a voltage Vwr_00.

Figure 9:
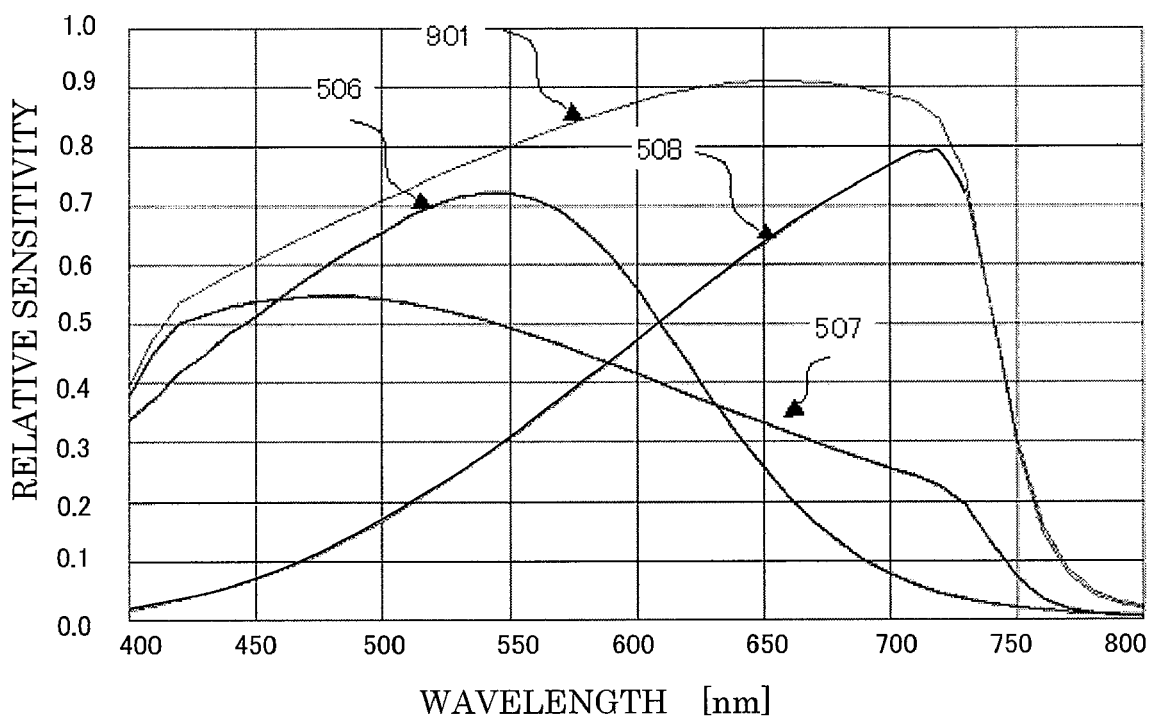
FIG. 9 shows spectral sensitivities of the photometry sensor in Embodiment 2.

FIG. 9 shows a spectral sensitivity characteristic 901 obtained by combining the third photoelectric conversion part shown in FIG. 8 with an IR cut filter 32. Graphs showing the same characteristics as those in FIG. 5C are denoted by the same reference numerals as those in FIG. 5C. The combination of the third photoelectric conversion part with the IR cut filter 32 provides the third photoelectric conversion part having a sensitivity of a certain level or more in a wavelength region wider than those of the first and second photoelectric conversion parts. The certain level is, for example, a relative sensitivity of 0.3 or 0.4 as shown in FIG. 9.

The spectral sensitivity characteristic 901 shown in FIG. 9 is set in the peripheral area of the photometry sensor 7 for the following reason. The photometry sensor 7 has to be disposed in a position shifted from a viewfinder optical axis extending toward an eyepiece 5 so as not to block a light flux passing through the eyepiece 5. Consequently, the amount of light entering the photometry sensor 7 is smaller in the peripheral area than that in the central area. Thus, in the peripheral area where the result of the focus detection does not have to be corrected, in other words, no focus detection area is present, to improve a characteristic for a low luminance, sensitivity has to be increased by the pixel structure as shown in FIG. 8.

Further, in this embodiment, as obvious from the spectral sensitivity characteristic shown in FIG. 9, capturing of more infrared light than the conventional photometry sensor (506) subjected to the luminous efficiency correction increases photometry errors due to the light source. However, the photometry errors can be corrected to a certain extent by using the outputs Vw and Vr obtained from the pixels having the structure shown in FIG. 4 which are disposed in the central area.

Figure 10:
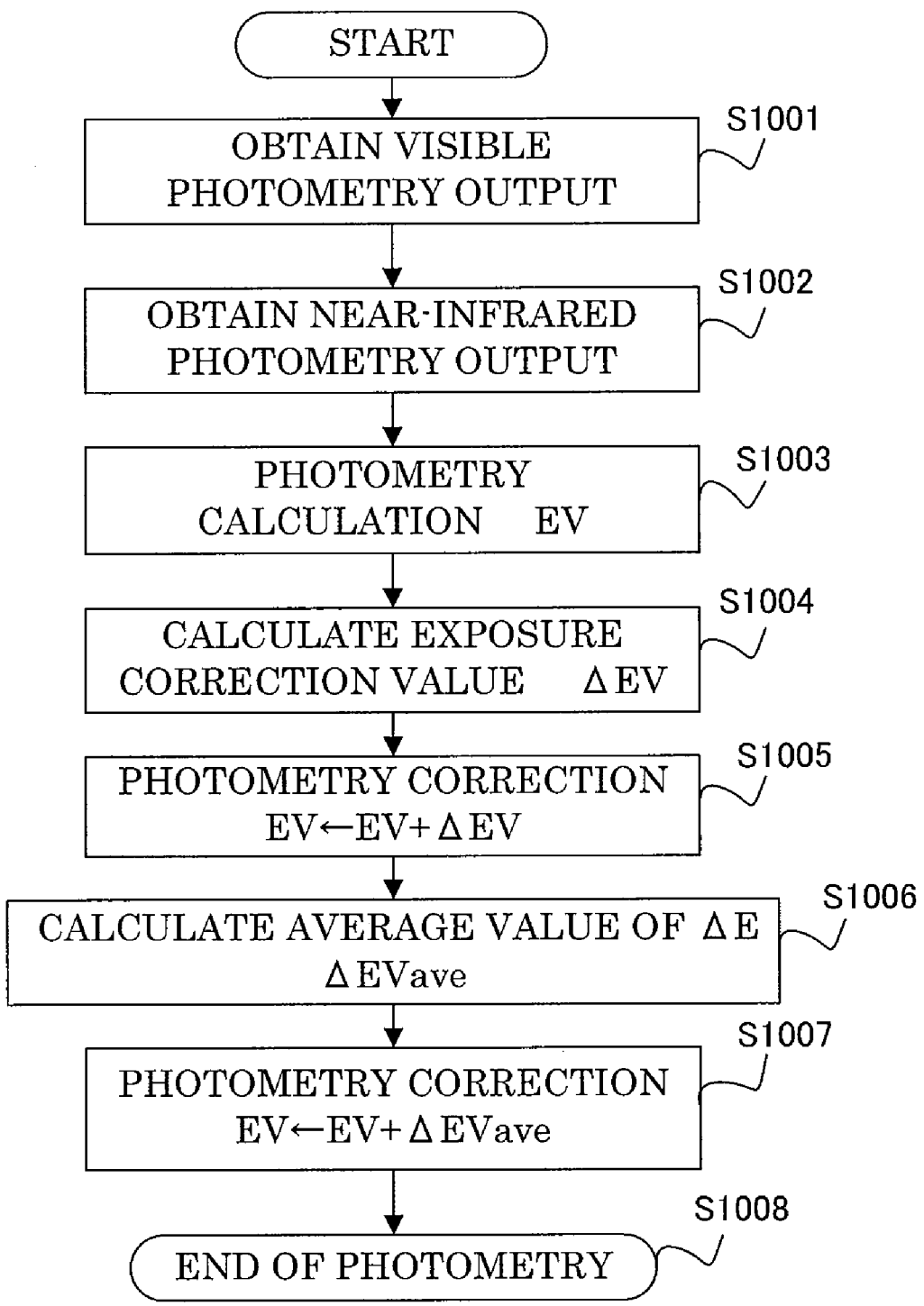
FIG. 10 is a flowchart showing a photometry operation in Embodiment 2.

FIG. 10 is a flowchart showing a photometry operation in this embodiment. The flowchart (steps s1001 to s1008) shown in FIG. 10 is used in place of steps s605 to s608 of the flowchart in Embodiment 1 shown in FIG. 6. In other words, for the AF operation, processes similar to those in Embodiment 1 are performed.

Upon start of the process in step s1000, in step s1001, a camera microcomputer 100 obtains voltages Vw and Vwr which are photometry outputs of the visible wavelength region (outputs from first and third photoelectric conversion parts) from the photometry sensor 7. The camera microcomputer 100 converts the voltages Vw and Vwr into digital data by an A/D converter to store them in a memory (not shown) provided inside the camera microcomputer 100.

In step s1002, the camera microcomputer 100 obtains a voltage Vr which is a photometry output of the near-infrared wavelength region (output from the second photoelectric conversion part) from the photometry sensor 7. The camera microcomputer 100 converts the voltage Vr into digital data by the A/D converter to store it in the memory.

In step s1003, the camera microcomputer 100 performs photometry calculation for each pixel based on the Vw data and the Vwr data which are pieces of photometry information obtained from each pixel in step s1001 to calculate (generate) an Ev value (exposure information) for each pixel.

In step s1004, the camera microcomputer 100 obtains, only for the pixels in the central area each of which includes the first and second photoelectric conversion parts, an exposure correction value (exposure correction information) ΔEv based on a ratio of the Vw data and the Vwr data obtained from each pixel.

In step s1005, the camera microcomputer 100 adds the exposure correction value ΔEv obtained in step s1004 to the Ev value calculated only for each pixel in the central area in step s1003 to generate a light-source-corrected Ev value for each pixel in the central area.

In step s1006, the camera microcomputer 100 calculates an average value (average exposure correction value) ΔEVave of the ΔEv values calculated for the pixels in the central area in step s1004 to store it in the memory.

In step s1007, the camera microcomputer 100 adds the average exposure correction value ΔEVave to the Ev value of each pixel in the peripheral area to obtain a light-source-corrected Ev value for each pixel in the peripheral area. Then, the camera microcomputer 100 performs predetermined weighting calculation for the light-source-corrected Ev values of all the pixels, and calculates and then calculates, based on the result of the weighting calculation, final exposure control values such as a shutter speed and an aperture value for the exposure operation. After that, the the camera microcomputer 100 finishes the photometry operation (s1008).

This embodiment compensates for a light amount reduction in the peripheral area by using the pixels having the same vertical structure including the first and second photoelectric conversion parts as that in Embodiment 1 in the central area of the image-pickup region and using the pixels constituted by the third photoelectric conversion part having a sensitivity in a wavelength region wider than those of the first and second photoelectric conversion parts in the peripheral area. Thereby, this embodiment can obtain color measurement information (color temperature or information of the light source) to correct a defocus amount, and can correct an error in the photometry output generated due to the color temperature or the light source while enhancing low luminance performance of the photometry sensor. Moreover, this embodiment can reduce an error in the photometry output generated due to a color in the peripheral area by correction using the color measurement information of the central area.

As described above, according to each embodiment, since the first and second photoelectric conversion parts are formed so that they at least partially overlap each other in the light entrance direction from the image-pickup optical system, the difference of the light-receiving fields of the first and second photoelectric conversion parts can be reduced without using any special optical system. Thus, a compact image-pickup apparatus which can improve the accuracy of the focus detection result correction or exposure correction depending on the color of the object (e.g., type of the light source) can be realized.

Furthermore, the present invention is not limited to these embodiments and various variations and modifications may be made without departing from the scope of the present invention.

This application claims the benefit of Japanese Patent Application No. 2007-203141, filed on Aug. 3, 2007, which is hereby incorporated by reference herein in its entirety.

What is claimed is:

1. An image-pickup apparatus comprising:
a focus detector which generates focus detection information by using light from an image-pickup optical system;
a photometer which generates photometry information by using the light from the image-pickup optical system;
a focus controller which performs focus control; and
an exposure controller which performs exposure control,
wherein the photometer includes a first photoelectric conversion part and a second photoelectric conversion part which have different spectral sensitivity characteristics and are formed to at least partially overlap each other in a light entrance direction from the image-pickup optical system, the photometer generating the photometry information based on an output from the first photoelectric conversion part,
wherein the focus controller performs the focus control by using the focus detection information and focus correction information obtained based on the output from the first photoelectric conversion part and an output from the second photoelectric conversion part, and
wherein the exposure controller performs the exposure control by using the photometry information and exposure correction information obtained based on the output from the first photoelectric conversion part and the output from the second photoelectric conversion part.

2. An image-pickup apparatus according to claim 1, wherein the focus controller and the exposure controller respectively perform the focus control and the exposure control by using the focus correction information and the exposure correction information obtained based on a ratio of the outputs from the first and second photoelectric conversion parts.

3. An image-pickup apparatus according to claim 1, wherein the first and second photoelectric conversion parts are formed on a same semiconductor substrate so as to at least partially overlap each other in a thickness direction of the substrate.

4. An image-pickup apparatus according to claim 1, wherein the photometer includes:
the first and second photoelectric conversion parts in a photometry area corresponding to a first area in an image-pickup region, the first area including a center of the image-pickup region; and
a third photoelectric conversion part having a sensitivity of a certain level or more for a wavelength region wider than those of the first and second photoelectric conversion parts in a photometry area corresponding to a second area that is more outside than the first area in the image-pickup region, and
wherein the photometer generates the photometry information based on the output from the first photoelectric conversion part and an output from the third photoelectric conversion part.

* * * * *